United States Patent
Kwon et al.

[19]

[11] Patent Number: 6,087,623
[45] Date of Patent: Jul. 11, 2000

[54] SEMICONDUCTOR DEVICE MARKING APPARATUS USING A ROTATING STOPPER

[75] Inventors: Mun Ki Kwon; Sung Ho Choi; Byung Mun Choi, all of Chungcheongnam-do, Rep. of Korea

[73] Assignee: Samsung Electronics Co., Ltd., Kyungki-do, Rep. of Korea

[21] Appl. No.: 09/094,076

[22] Filed: Jun. 9, 1998

[30] Foreign Application Priority Data

Sep. 19, 1997 [KR]  Rep. of Korea ..................... 97-047700

[51] Int. Cl.⁷ ............................. B23K 26/00; B65G 47/22
[52] U.S. Cl. ................................ 219/121.68; 219/121.82; 198/419.1
[58] Field of Search ........................ 219/121.68, 121.82; 198/419.1, 463.4, 459.6

[56] References Cited

U.S. PATENT DOCUMENTS

| | | | |
|---|---|---|---|
| 2,769,520 | 11/1956 | Davidson et al. | 198/463.4 |
| 3,827,582 | 8/1974 | Lederer | 198/419.1 X |
| 4,298,118 | 11/1981 | Cottrell | 198/419.1 X |
| 4,662,500 | 5/1987 | Agnew | 198/463.4 X |
| 4,921,088 | 5/1990 | Horst | 198/419.1 X |
| 4,998,614 | 3/1991 | Reimenschneider et al. | 198/463.4 |
| 5,303,811 | 4/1994 | Haley | 198/419.1 |

FOREIGN PATENT DOCUMENTS

| | | | |
|---|---|---|---|
| 61-282217 | 12/1986 | Japan | 198/463.4 |
| 1578073 | 7/1990 | U.S.S.R. | 198/419.1 |

*Primary Examiner*—Gregory Mills
*Attorney, Agent, or Firm*—Skjerven, Morrill, MacPherson, Franklin & Friel LLP; David T. Millers

[57] ABSTRACT

The present invention provides a semiconductor device marking apparatus comprising a package loader, on which a plurality of semiconductor device packages are loaded, a package provider, which provides the semiconductor device packages one by one from the package loader, a transfer rail, which transfers the semiconductor device packages provided by the package provider, a marker, which marks an alphanumeric code on the front surfaces of the semiconductor device packages transferred by the transfer rail, a rotating stopper comprising a stop plate and a package control shaft, and a package unloader, on which the semiconductor device packages passing through the rotating stopper are loaded. Further, the present invention provides a rotating stopper for temporarily stopping semiconductor device packages to be transferred along a transfer rail, the rotating stopper comprising a stop plate and a package control shaft. The present invention advantageously prevents problems such as the replacement of worn-out parts and improves the efficiency of the semiconductor device marking process.

14 Claims, 6 Drawing Sheets

SEMICONDUCTOR DEVICE MARKING APPARATUS USING A ROTATING STOPPER

BACKGROUND OF THE INVENTION

1. Field of the Invention

The present invention relates generally to a semiconductor manufacturing apparatus, and more particularly to a rotating stopper which controls the number of semiconductor device packages provided to a package unloader after the packages have passed through a marker, and to a semiconductor device marking apparatus using the stopper.

2. Description of the Related Arts

Usually, prior to delivery of semiconductor device packages to the users, one surface of the semiconductor device package, usually the front surface, is marked with an alphanumeric code indicating the function, property, type of device, number of I/O pins, speed, manufacturing date, and manufacturer of the device. An apparatus, which is used in marking the code on the front surface of the package, is referred to as a "marking apparatus". An automatic marking apparatus employing a laser as the marker has been commonly used.

FIG. 1 is a front view of a conventional semiconductor device marking apparatus. Referring to FIG. 1, a semiconductor device marking apparatus 10 comprises a package loader 20, a package provider 30, a marker 40, a brush carrier 50, and a package unloader 70. Herein, all the components are positioned on a support 12, which has a tilted front surface. The package provider 30, the marker 40, the brush carrier 50, and the package unloader 70 are installed on the tilted front surface of the support 12.

In the package loader 20, a plurality of tubes 24 are loaded on a support table 26 between two loading rods 22. Each tube 24 is filled with a predetermined number of semiconductor device packages 28. The tubes 24 which are loaded on the support table 26 are provided to the package provider 30 automatically or manually, one by one, as indicated by an arrow "A".

The semiconductor device packages 28 within the tube 24, which is provided to the package provider 30, are transferred in the direction of an arrow "B" along a transfer rail 14. Since the transfer rail 14 is tilted at a certain angle as shown in FIG. 1, the packages 28 may be transferred along the transfer rail 14 by gravity without a special driving force. Next, the semiconductor device packages 28 are marked as they pass through the marker 40. In the marking step, an alphanumeric code is marked on the front surfaces of the semiconductor device packages 28 to indicate the function, property, type of device, number of I/O pins, operational speed, manufacturing date, and manufacturer of the device. The semiconductor device packages, which have passed through the marker 40, are indicated by reference numeral "29".

The semiconductor device packages 29, which are output from the marker 40, are retained on the transfer rail 14 by the brush carrier 50. The brush carrier 50 blocks the packages 29, and when a predetermined number of semiconductor device packages 29 are loaded, the brush carrier 50 moves in the direction of an arrow "D". Then, a brush 60, which is positioned beyond the upper surface of the transfer rail 14, cleans the packages 29 by brushing the marked code on the front surfaces of the packages 29. After brushing, the brush carrier 50 moves further downward in the direction of the arrow "D" until it reaches a stopper 58, which is fixed to a stop plate 16. Next, the brush carrier 50 releases the semiconductor device packages 29 and the packages 29 are inserted into tubes 74, which are loaded on a support table 76 between two loading rods 72 of the package unloader 70. After the packages 29 entirely fill one tube 74, the loading rods 72 descend in the direction of an arrow "E" and the packages 29 fill the next tube 74. At this time, since the tubes 74 are controlled such that the lower surface of the tube 74 is coplanar with the upper surface of the transfer rail 14, the packages 29 are inserted into the tubes 74 by gravity FIG. 2 is a front view of a brush carrier, which is used in the conventional semiconductor device marking apparatus of FIG. 1. The brush carrier 50 moves along a cylinder 51 in the direction of the arrow "D" and a roller unit 52 is connected to the cylinder 51. The roller unit 52 is also connected to a lower support plate 53. The lower support plate 53 is connected to an upper support plate 55 by a support body 54, and a clamp 56 is connected to the upper support plate 55 by springs 57 or bushings (not shown).

When the clamp 56 is in the upright position, the clamp 56 protrudes from the upper surface of the transfer rail 14 and blocks the semiconductor device packages 29, which are transferred by gravity. After a predetermined number of semiconductor device packages 29 are loaded by the blocking action of the clamp 56, the brush carrier 50 moves, and the clamp 56 transfers the packages 29 downward. Then, the marked code on the front surfaces of the packages 29 is cleaned by the operation of a brush 60, which rotates in the direction of an arrow "F". After brushing, the brush carrier 50 moves further downward until it reaches a stopper 58. When the clamp 56 contacts a terminal of the stopper 58, it is rotated clockwise to a horizontal position by the terminal of the stopper 58, as indicated by an arrow "G". When the clamp 56 is in the horizontal position, the packages 29, the motion of which was blocked by the clamp 56, are freely transferred along the transfer rail 14.

After the semiconductor device packages 29 are inserted into the tube 74 of the package unloader 70, the brush carrier 50 returns to its original position and the clamp 56 returns to the earlier upright position by the restoring force of the springs. After that, again the clamp 56 blocks the next semiconductor device packages 29.

The semiconductor device marking apparatus using the conventional brush carrier described above has several problems:

First, since the brush carrier requires the semiconductor device package to move downward in order to clean the front surface on which the alphanumeric code is marked, the outer leads of the semiconductor device package may be easily damaged.

Second, since the brush carrier has a complicated structure with many individual parts, worn-out parts need to be replaced frequently, and since the clamp is controlled by the restoring force of a spring, the spring is apt to be easily worn out.

Third, since recently the marking technique has been greatly developed such that the front surface of the package, on which the code is marked, need not be cleaned, it is sufficient that the brush carrier only control the number of semiconductor device packages provided to the tubes of the package unloader by temporarily blocking a predetermined number of semiconductor device packages transferred along the transfer rail and by providing the packages to the package unloader. That is, there are now many unnecessary procedures in the conventional semiconductor device marking apparatus.

SUMMARY OF THE INVENTION

Accordingly, an object of the present invention is to provide a rotating stopper which has a simpler structure and can control the number of provided semiconductor device packages, and to provide a semiconductor device marking apparatus using the rotating stopper.

In order to achieve this and other objects, the rotating stopper of the present invention comprises a stop plate, which stops a predetermined number of the packages to be transferred along the transfer rail, and a package control shaft, which rotates and is connected to the stop plate. When the package control shaft is rotated such that the stop plate is in the upright position, the stop plate blocks the packages by protruding from the upper surface of the transfer rail and the packages stop, and when the package control shaft is rotated such that the stop plate is in the horizontal position, under the upper surface of the transfer rail, the stop plate releases the packages and the packages are transferred along the transfer rail.

In another aspect, a semiconductor device marking apparatus of the present invention comprises a package loader, on which a plurality of semiconductor device packages are loaded, a package provider, which provides the semiconductor device packages one by one from the package loader, a transfer rail, which transfers the semiconductor device packages provided by the package provider, a marker, which marks an alphanumeric code on the front surfaces of the semiconductor device packages transferred by the transfer rail, a rotating stopper comprising a stop plate and a package control shaft, and a package unloader, on which the semiconductor device packages passing through the rotating stopper are loaded.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 1:
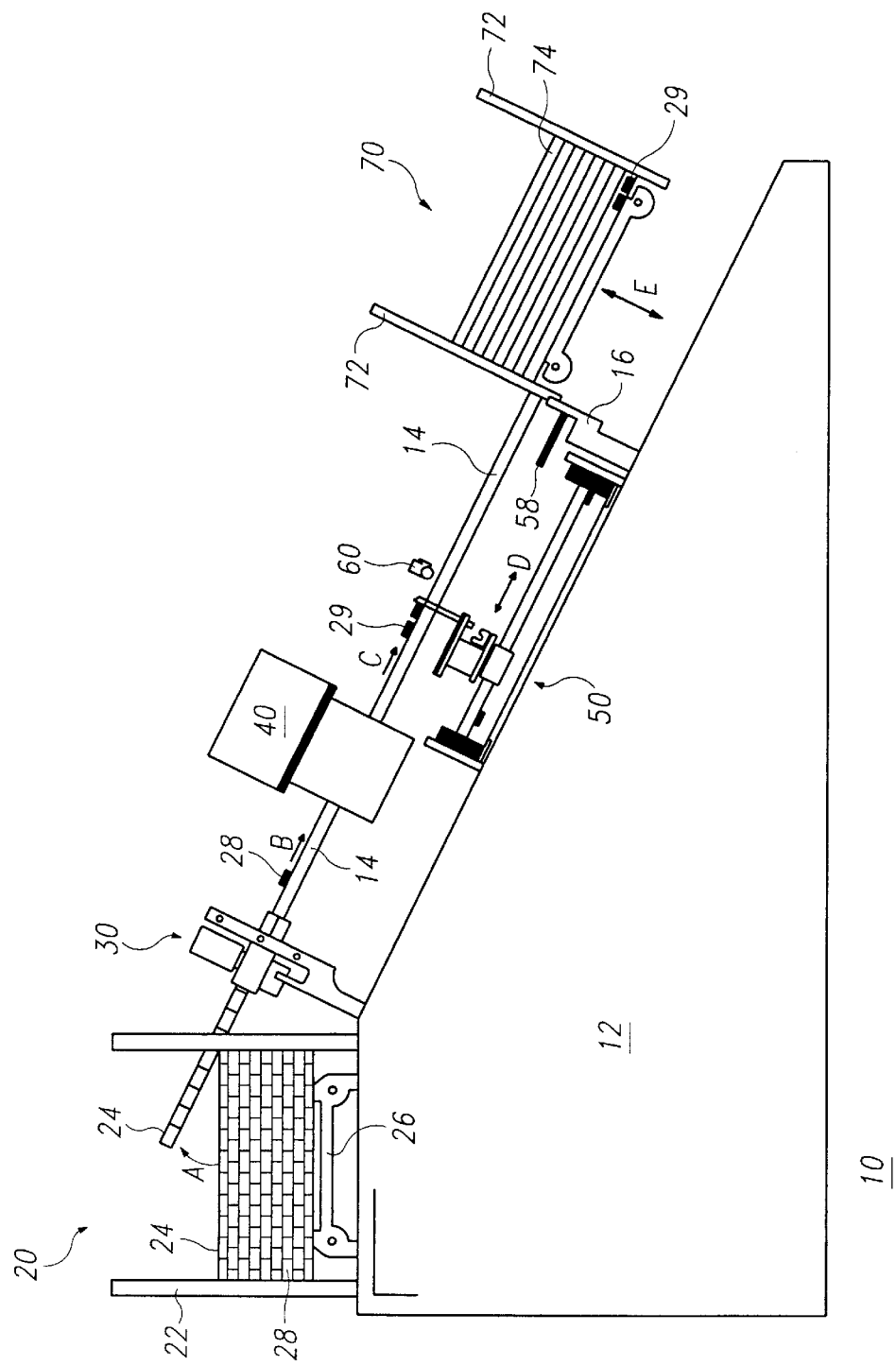
FIG. 1 is a front view of a conventional semiconductor device marking apparatus.
Figure 2:
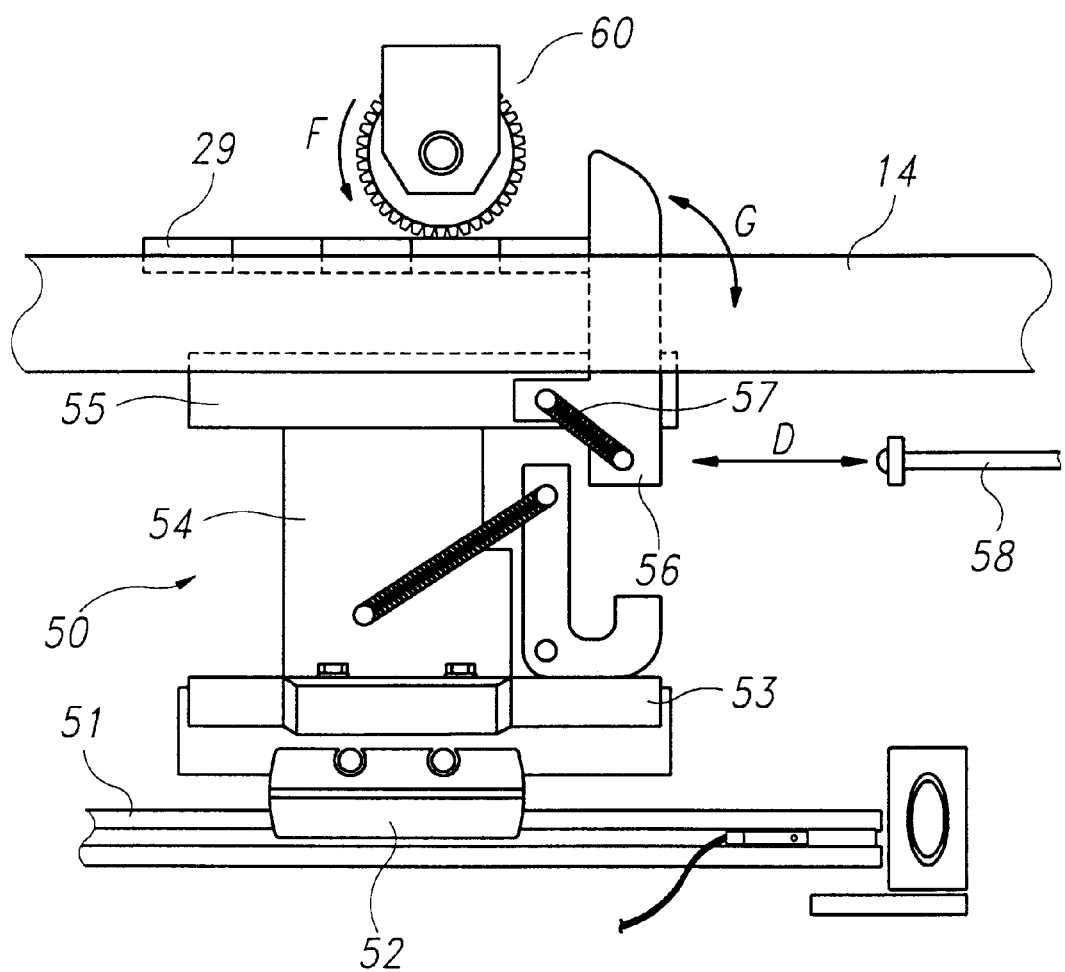
FIG. 2 is a front view of a brush carrier which is used in the conventional semiconductor device marking apparatus of FIG. 1.
Figure 3:
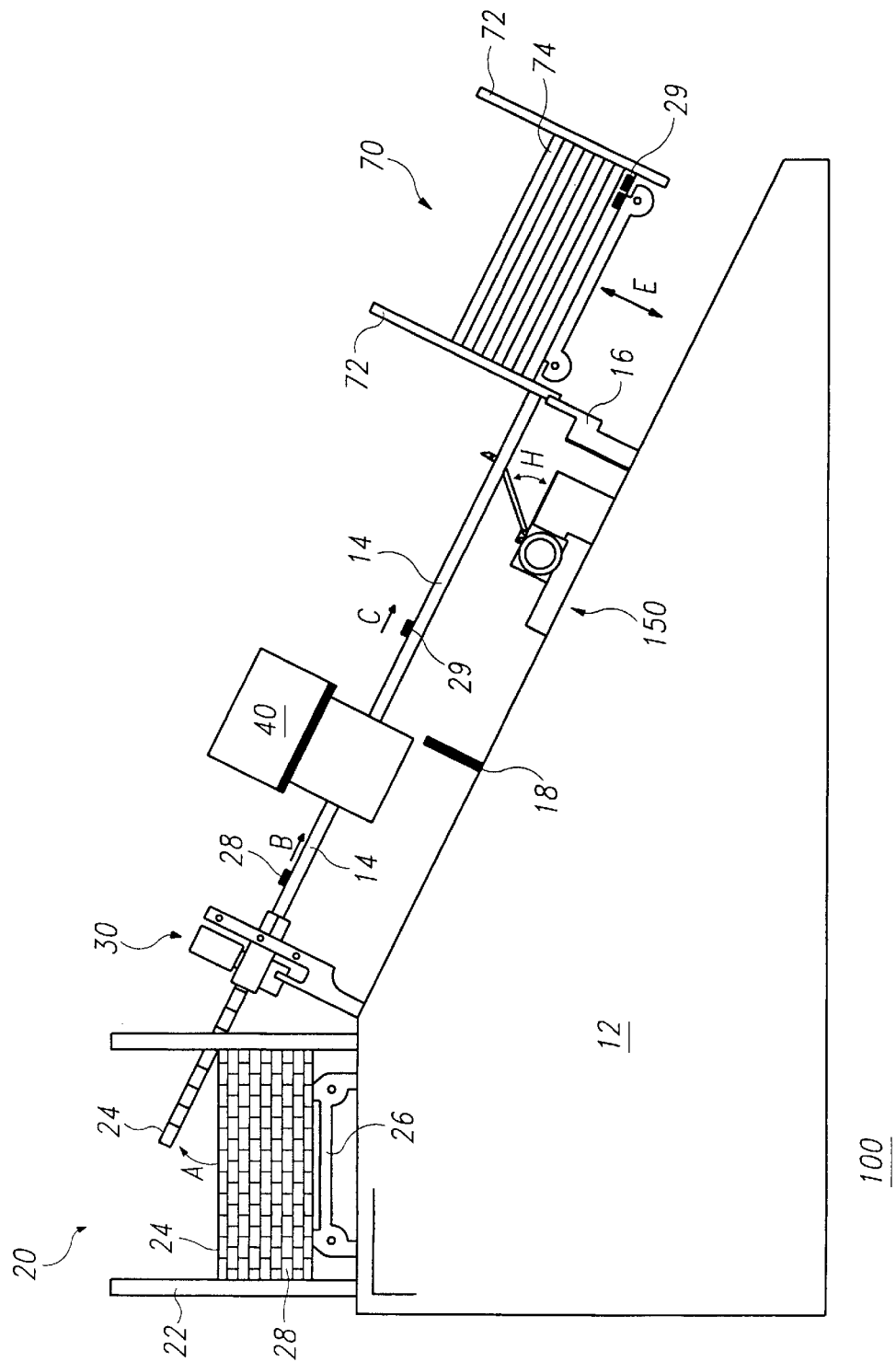
FIG. 3 is a front view of a semiconductor device marking apparatus according to the present invention.

FIG. 3 is a front view of a semiconductor device marking apparatus according to the present invention. With reference to FIG. 3, a semiconductor device marking apparatus 100 comprises a package loader 20, a package provider 30, a marker 40, a rotating stopper 150, and a package unloader 70. Herein, all the components are positioned on a support 12, which has a tilted front surface. The package provider 30, the marker 40, the rotating stopper 150, and the package unloader 70 are installed on the tilted front surface of the support 12.

In the package loader 20, a plurality of tubes 24 are loaded on a support table 26 between two loading rods 22. Each tube 24 is filled with a predetermined number of semiconductor device packages 28. The tubes 24, which are loaded on the support table 26, are provided to the package provider 30 automatically or manually, one by one, as indicated by an arrow "A".

The semiconductor device packages 28 within the tube 24, which is provided to the package provider 30, are transferred in the direction of an arrow "B" along a transfer rail 14. Since the transfer rail 14 is tilted at a certain angle as shown in FIG. 3, the packages 28 are transferred along the transfer rail 14 by gravity without a special driving force. Next, the semiconductor device packages 28 are marked as they pass through the marker 40. In the marking step, an alphanumeric code is marked on the front surfaces of the semiconductor device packages 28 to indicate the function, property, type of device, number of I/O pins, operational speed, manufacturing date, and manufacturer of the device. The marker 40 employs a laser to mark the code on the front surfaces of the packages 28. The semiconductor device packages, which have passed through the marker 40, are indicated by a reference numeral "29".

The number of semiconductor device packages 29, which have been output from the marker 40, is detected by a sensor 18. The rotating stopper 150 of the present invention is controlled by the data detected by the sensor 18. The rotating stopper 150 provides a predetermined number of semiconductor device packages 29, to the package unloader 70. These packages have passed through the marker 40 and are transferred in the direction of an arrow "C" on the transfer rail 14, to the package unloader 70. In addition, the rotating stopper 150 reduces the impact on the semiconductor device packages 29 during the transfer process. In the conventional semiconductor device marking apparatus, since the packages 29 are transferred by gravity directly into the tube of the package unloader 70, the packages 29 may be damaged by impact.

Figure 4:
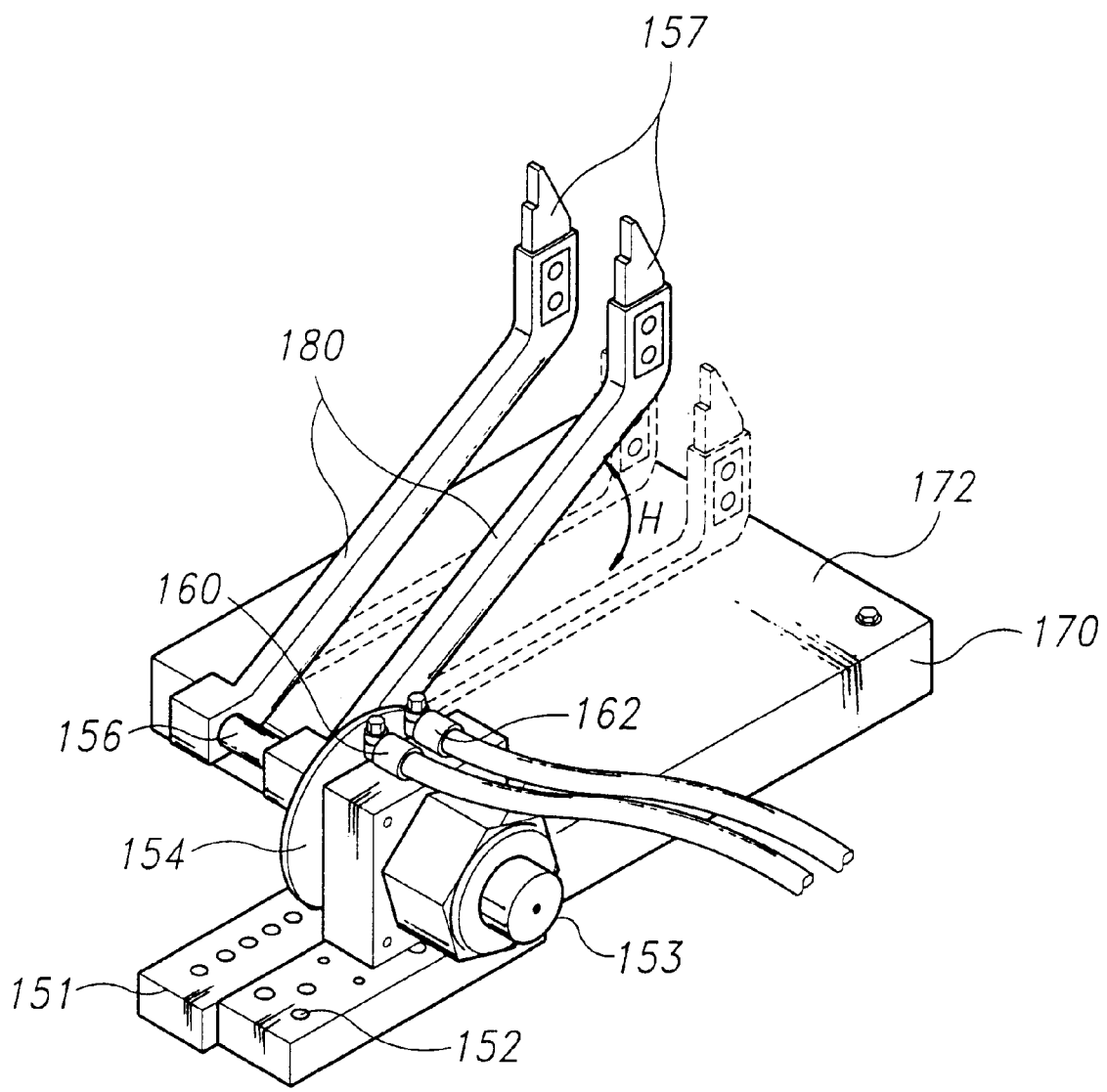
FIG. 4 is a perspective view of a rotating stopper according to the present invention.
Figure 6:
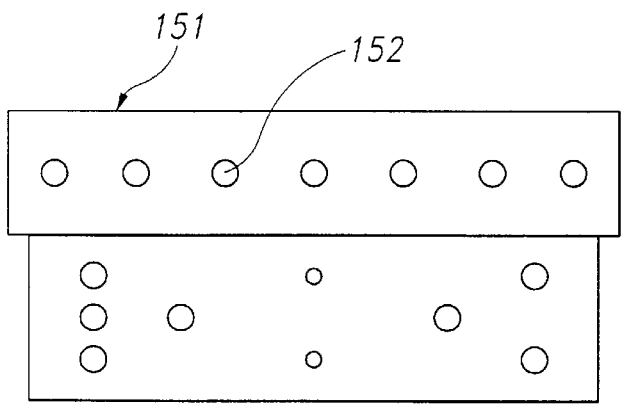
FIG. 6 is a schematic view of a base plate of the rotating stopper according to the present invention.

FIG. 4 is a perspective view of a rotating stopper according to the present invention. A motor 153 supplies the rotating power for driving the rotating stopper 150. The motor 153 is fixed into a fixing hole 152 of a base plate 151 as shown in FIG. 6. The stop position of the packages 29 on the transfer rail 14 is adjusted according to the package size. The stop position is controlled by choosing one among a plurality of the fixing holes 152 of the base plate 151.

The rotating power of the motor 153 is transmitted to a package control shaft 180 by a block 154 and a rotating shaft 156. Motor 153 drives rotation of the block 154 and the rotating shaft 156. The package control shaft 180, which is connected to the rotating shaft 156, is also rotated in the direction of an arrow "H" by motor 153.

Figure 5:
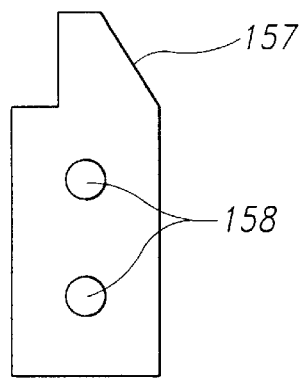
FIG. 5 is a schematic view of a stop plate of the rotating stopper according to the present invention.
Figure 7:
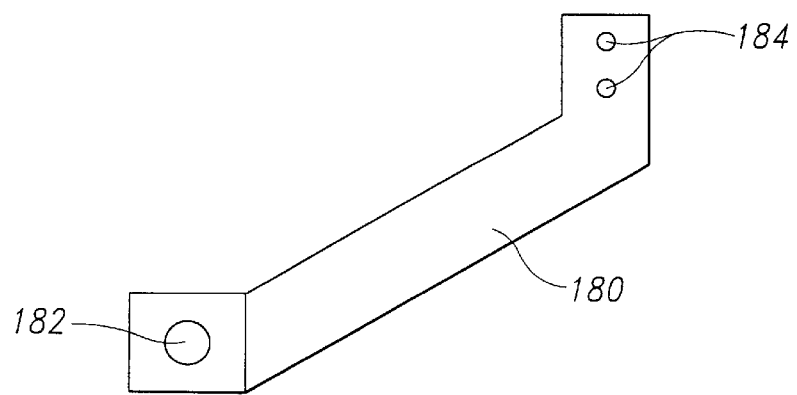
FIG. 7 is a schematic view of a package control shaft of the rotating stopper of according to the present invention.

As shown in FIG. 5 and FIG. 7, a stop plate 157 is connected to an end of the package control shaft 180 through plate holes 158 of the stop plate 157 and first connection holes 184 of package control shaft 180, which has a shape as shown in FIG. 7. Another end of the package control shaft 180 is connected to the rotating shaft 156 through a second connection hole 182.

In FIG. 4, the package control shaft 180 and the stop plate 157 are shown in solid lines for the upright position and in dotted lines for the horizontal position. As described above, when the package control shaft 180 and the stop plate 157 are in the upright position, the transferred packages 29 are blocked by the stop plate 157 and thereby the packages 29 stop. When the package control shaft 180 and the stop plate 157 are in the horizontal position, the blocked packages 29 are released and inserted into the tubes 74 which are loaded on the support table 76 in the package unloader 70

A speed controller 160 determines whether the package control shaft 180 is in the upright or the horizontal position. The speed controller 160 operates based on data detected by sensor 18 which is positioned on the output area of the marker 40.

When the package control shaft 180 and the stop plate 157 are in the horizontal position, the lower surface of the package control shaft 180 contacts a buffer member 172 of a buffer plate 170. Thereby, the impact on the package control shaft 180 and the noise of the impact is reduced.

Figure 8:
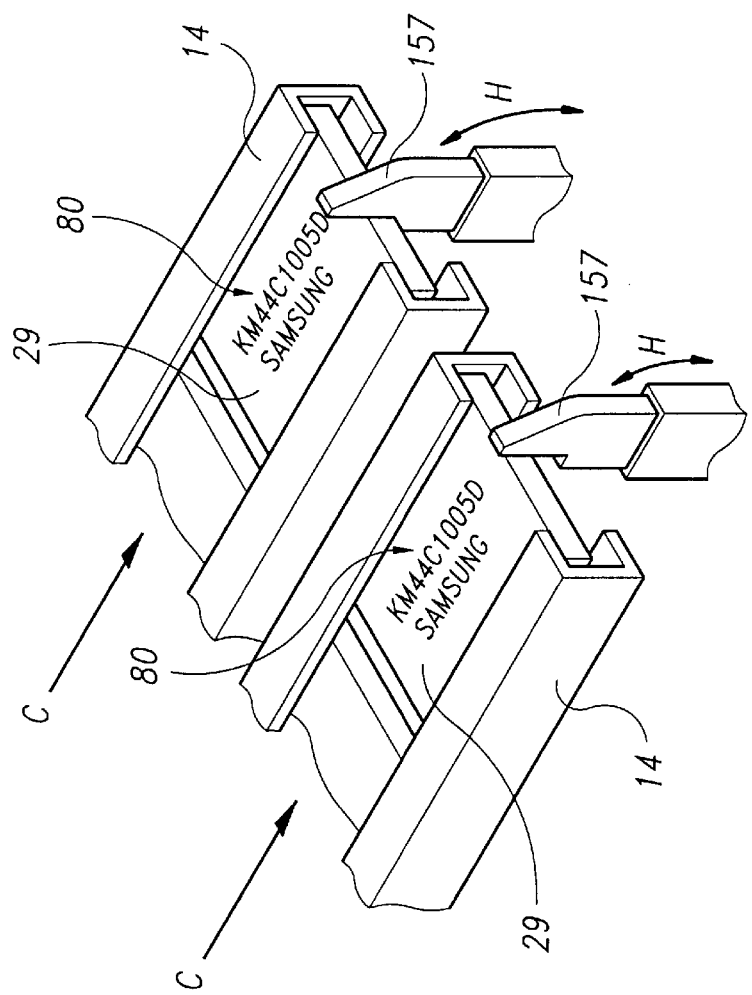
FIG. 8 is a partially enlarged perspective view depicting semiconductor device packages stopped by the rotating stopper according to the present invention.

FIG. 8 is a partially enlarged perspective view depicting stopping of the semiconductor device packages by the rotating stopper according to the present invention. With reference to FIG. 8, the code 80, for example KM 44 C1005D/SAMSUNG, is marked on the front surfaces of the packages 29, which pass through the marker 40. The packages 29 are inserted into a slot of the transfer rail 14 and transferred in the direction of an arrow "C". The stop plate 157 in the upright position blocks the motion of the transferred packages 29 and the semiconductor device packages 29 stop. After a predetermined number of semiconductor device packages 29 are loaded on the transfer rail 14, the stop plate 157 moves in the direction of an arrow "H" and is positioned under the transfer rail 14. This is the horizontal position of the stop plate 157. Then, the blocked packages 29 are released and freely transferred along the transfer rail 14. Next, the semiconductor device packages 29 are inserted into the tubes 74 of the package unloader 70.

After completing the marking step using the semiconductor device marking apparatus 100 of the present invention, the semiconductor device packages 29, which are loaded in the tubes 74, are given a package appearance test. In the package appearance test, the code marked on the front surface of the package and the appearance of the package are tested. After this test, the final semiconductor products are supplied to the users.

Since the semiconductor device marking apparatus according to the present invention has a rotating stopper having a simple structure, it avoids problems such as the replacement of worn-out parts. Further, since the semiconductor device marking apparatus of the present invention may control the number of provided semiconductor device packages without any unnecessary procedures, it improves the efficiency of the semiconductor device marking process.

Although a preferred embodiment of the present invention has been described in detail hereinabove it should be clearly understood that many variations and/or modifications of the basic inventive concepts herein taught which may appear to those skilled in the art will still fall within the spirit and scope of the present invention as defined in the appended claims.

For example, although a preferred embodiment of the present invention uses a marker, which employs the laser-marking method, it should be clearly understood that many variations and/or modifications, which employ various marking methods other than the laser-marking method, will also fall within the spirit and scope of the present invention as defined in the appended claims.

What is claimed is:

1. A semiconductor device marking apparatus, which marks semiconductor device packages, the apparatus comprising:
    a transfer rail, which transfers the semiconductor device packages;
    a marker, which marks the semiconductor device packages transferred by the transfer rail;
    a rotating stopper, which comprises a stop plate, a control shaft, and a buffer plate, the stop plate temporarily stopping sets of the semiconductor device packages which are output from the marker and transferred along the transfer rail, the control shaft rotating and being connected to the stop plate, and the buffer plate having a buffer member such that a lower surface of the stop plate contacts the buffer member when the stop plate is in a horizontal position; and
    a package unloader, on which the semiconductor device packages passing through the rotating stopper are loaded,
    wherein the stop plate blocks the semiconductor device packages by protruding from an upper surface of the transfer rail, when the stop plate is placed in an upright position by rotation of the package control shaft, and the stop plate releases the semiconductor device packages, when the stop plate is placed in the horizontal position, under the transfer rail, by rotation of the control shaft.

2. The semiconductor device marking apparatus of claim 1, wherein the transfer rail is tilted at an angle such that the semiconductor device packages on the transfer rail are transferred by gravity.

3. The semiconductor device marking apparatus of claim 1, further comprising a sensor positioned on the transfer rail to detect the semiconductor device packages, which are output from the marker, the rotation of the control shaft being controlled according to data detected by the sensor.

4. The semiconductor device marking apparatus of claim 1, wherein a plurality of tubes for housing semiconductor device packages is loaded in the package unloader.

5. The semiconductor device marking apparatus of claim 1, further comprising:
    a package loader, on which the semiconductor device packages are loaded; and
    a package provider, which provides the semiconductor device packages from the package loader, along the transfer rail.

6. The semiconductor device marking apparatus of claim 1, wherein the marker is a laser-marker.

7. The semiconductor device marking apparatus of claim 1, wherein the rotating stopper further comprises a sensor positioned on the transfer rail to detect the semiconductor device packages, which are output from a marker, the rotation of the control shaft being controlled according to data detected by the sensor.

8. The semiconductor device marking apparatus of claim 1, wherein the rotating stopper further comprises a motor for providing rotating power to the control shaft.

9. The semiconductor device marking apparatus of claim 8, wherein the rotating stopper further comprises:
    a base plate, to which the motor is fixed;
    a block, rotated by the rotating power of the motor; and
    a rotating shaft, which is connected to both the block and the control shaft and transmits the rotating power of the motor from the block to the control shaft.

10. A rotating stopper for stopping semiconductor device packages, which are transferred along a transfer rail, the rotating stopper comprising:
- a stop plate which temporarily stops a predetermined number of packages to be transferred along the transfer rail;
- a control shaft which rotates and is connected to the stop plate;
- a buffer plate having a buffer member such that a lower surface of the stop plate contacts the buffer member when the stop plate is in a horizontal position,
- wherein the stop plate blocks the packages by protruding from an upper surface of the transfer rail, when the stop plate is placed in an upright position by rotation of the control shaft, and the stop plate releases the packages, when the stop plate is placed in the horizontal position, under the transfer rail, by rotation of the control shaft.

11. The rotating stopper of claim 10, further comprising a sensor positioned on the transfer rail to detect the semiconductor device packages, which are output from a marker, the rotation of the control shaft being controlled according to data detected by the sensor.

12. The rotating stopper of claim 10, further comprising a motor for providing rotating power to the control shaft.

13. The rotating stopper of claim 12, further comprising:
- a base plate, to which the motor is fixed;
- a block, rotated by the rotating power of the motor; and
- a rotating shaft, which is connected to both the block and the control shaft and transmits the rotating power of the motor from the block to the control shaft.

14. The rotating stopper of claim 13, wherein a plurality of fixing holes for fixing the motor are formed in and on the base plate and the specific fixing hole in which the motor is fixed is determined by the size of the semiconductor device packages transferred along the transfer rail.

* * * * *